United States Patent
Satoh

(10) Patent No.: US 7,205,856 B2
(45) Date of Patent: Apr. 17, 2007

(54) PIEZOELECTRIC OSCILLATOR

(75) Inventor: Tomio Satoh, Kanagawa (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 645 days.

(21) Appl. No.: 10/753,986

(22) Filed: Jan. 7, 2004

(65) Prior Publication Data

US 2006/0061427 A1    Mar. 23, 2006

(30) Foreign Application Priority Data

Jan. 10, 2003    (JP)    ............................. 2003-005082
Apr. 25, 2003    (JP)    ............................. 2003-122049

(51) Int. Cl.
     *H03B 5/36*    (2006.01)
(52) U.S. Cl. ............... 331/116 R; 331/158; 331/177 V
(58) Field of Classification Search ............. 331/36 C, 331/116 R, 116 FE, 158, 177 V
See application file for complete search history.

(56) References Cited

U.S. PATENT DOCUMENTS 6,836,190 B2 * 12/2004 Kato ........................... 331/158
6,952,140 B2 * 10/2005 Tamaru ....................... 331/158
7,009,459 B2 * 3/2006 Satoh et al. ................. 331/158

* cited by examiner

*Primary Examiner*—David Mis
(74) *Attorney, Agent, or Firm*—Darby & Darby

(57) ABSTRACT

A piezoelectric oscillator including a piezoelectric vibrator that vibrate at desired frequency; a first transistor for exciting the piezoelectric vibrator; a second transistor whose collector connects to an emitter of the first transistor, the second transistor being a base grounded type; a first capacitor connected between the emitter of the first transistor and ground; a series circuit comprising the piezoelectric vibrator and a second capacitor being connected between a base of the first transistor and an emitter of the second transistor, in which the first capacitor and a composition capacitance between base and emitter of the first transistor functions as a split capacitor for a feedback circuit of the Colpitts oscillator.

8 Claims, 12 Drawing Sheets

PRIOR ART

PIEZOELECTRIC OSCILLATOR

BACKGROUND OF THE INVENTION

1. Field of the Invention

The present invention relates to a piezoelectric oscillator, and in particular to a piezoelectric oscillator in which a current of a piezoelectric resonator is reduced.

2. Prior Art

In recent years, mobile radio communication equipment and transmission communication equipment are reduced in size, and are required highly-performance. With these requirements, it is also required miniaturization and high-stabilization to a piezoelectric oscillator utilized in these devices as a frequency control device. A piezoelectric oscillator is comprised of a piezoelectric vibrator, a frequency trimming circuit, and a frequency-temperature controlled circuit.

A piezoelectric vibrator is an electro-mechano-vibrator, and it has a high reliability against aged deterioration since an electric current flows in the piezoelectric vibrator (hereinafter referred to as "vibrator current") is a little. FIG. 4 shows an example of a conventional Colpitts oscillator using a silicon transistor. A serial circuit of capacitor Cb and capacitor Ce, which serve as a load capacitor for the Colpitts oscillator, is connected between base of a transistor TR11 and ground.

A point between the capacitors Cb and Ce is connected with emitter of the transistor TR11, and the point is grounded via resistor Re. In addition, a base bias circuitry comprising resistor RB 11 and R12 is connected to the base of transistor TR11. A series circuit comprised of piezoelectric vibrator Xtal and capacitor C11 is connected between the base of the transistor TR11 and ground. A collector of the transistor TR11 is connected to a source voltage Vcc line.

Value of resistors, capacitors of the Colpitts oscillator are set as shown in FIG. 4, and frequency of the piezoelectric vibrator Xtal is of 10 MHz, signal levels are 537 mVrms at the point A, 296 mVrms at the point B, and 229 mVrms at the point C, respectively. Power current (current consumption of an oscillating circuit) is 7.14 mA at the oscillation.

There is a Colpitts oscillator having a silicon transistor connected between a collector of the transistor TR11 and the source voltage line Vcc. Capacitor Cb between the base and emitter of the transistor TR11 is in range of 0 pF to 100 pF in this circuit, a vibrator current ix is increased as the value of the capacitor Cb. The vibrator current ix maintains constant when the value of the capacitor Cb is above 100 pF. According to the experiment result, the highest vibrator current ix was 6500 μA.

Another way to suppress the vibrator current, there is a Colpitts oscillator in which a base current of a transistor is controlled by an AGC circuit. A vibrator current is suppressed since the AGC circuit lowers a gain of the transistor. However, the Colpitts oscillator using the AGC circuit has the problem that miniaturization of the oscillator and low cost cannot be achieved.

A conventional Colpitts oscillator without an AGC circuit, a suppression of a vibrator current is restricted since the vibrator current increases with increment of capacity between base and emitter of the transistor. On the other hand, using an AGC circuit can lower the vibrator current. However, circuitry becomes complicated, and miniaturization is difficult.

The object of the present invention is to provide a small size piezoelectric oscillator capable of suppressing vibrator current by simple circuit configuration, and having a favorable aging characteristic.

SUMMARY OF THE INVENTION

In order to solve the problems, in accordance with a first aspect of the present invention, the above described object is achieved by a piezoelectric oscillator comprising: a piezoelectric vibrator that vibrate at desired frequency; a first transistor for exciting the piezoelectric vibrator; a second transistor whose collector connects to an emitter of the first transistor, the second transistor being a base grounded type; a first capacitor connected between the emitter of the first transistor and ground; a series circuit comprising the piezoelectric vibrator and a capacitor being connected between a base of the first transistor and an emitter of the second transistor, in which the first capacitor and a composition capacitance between base and emitter of the first transistor functions as a divided capacitor for a feedback circuit of the Colpitts oscillator.

In accordance with a first aspect of the present invention, a capacitor provided between a base and an emitter of the oscillating transistor (the first transistor) in the conventional oscillator can be omitted. In addition, the base grounded type transistor (the second transistor) is connected to the first transistor in cascode configuration; the emitter of the first transistor is grounded via capacitor. Thereby, the Colpitts oscillator whose vibration current is a very low can be obtained since capacitance component between base and emitter of the first transistor is small.

In accordance with a second aspect of the present invention, a piezoelectric oscillator comprising: a piezoelectric vibrator that vibrate at desired frequency; a first transistor for exciting the piezoelectric vibrator; a second transistor whose collector connects to an emitter of the first transistor, the second transistor being a base grounded type; a first capacitor connected between the emitter of the first transistor and ground; a second capacitor connected between a collector and the emitter of the first transistor; a series circuit comprising the piezoelectric vibrator and a capacitor being connected between a base of the first transistor and an emitter of the second transistor, in which the first capacitor and a composition capacitance between base and emitter of the first transistor functions as a divided capacitor for a feedback circuit of the Colpitts oscillator. An output of the emitter can be controlled by a collector output since phase of the signals at the collector and the emitter differs 180 degrees.

In accordance with a third aspect of the present invention, the above described object is achieved by a piezoelectric oscillator according to any one of the first and second aspects of the present invention, in which a base of said second transistor being grounded via capacitor.

In accordance with a fourth aspect of the present invention, the above described object is achieved by a piezoelectric oscillator according to any one of the first and second aspects of the present invention, in which a capacitor being connected between said base and emitter of said first transistor, thereby a variation of said composition capacitance between base and emitter of said first transistor being cancelled, and high frequency stability being obtained.

In accordance with a fifth aspect of the present invention, the above described object is achieved by a piezoelectric oscillator according to any one of the first and second aspects of the present invention, in which a base of said second transistor being grounded via capacitor, and a capacitor being connected between said base and emitter of said first transistor, thereby a variation of said composition capacitance between base and emitter of said first transistor being cancelled, and high frequency stability being obtained.

DETAILED DESCRIPTION FO THE PREFERRED EMBODIMENTS

Hereinafter, the present invention will be described in detail by referring an illustrated embodiment. However, the present invention is not limited to the embodiments described below.

Figure 1:
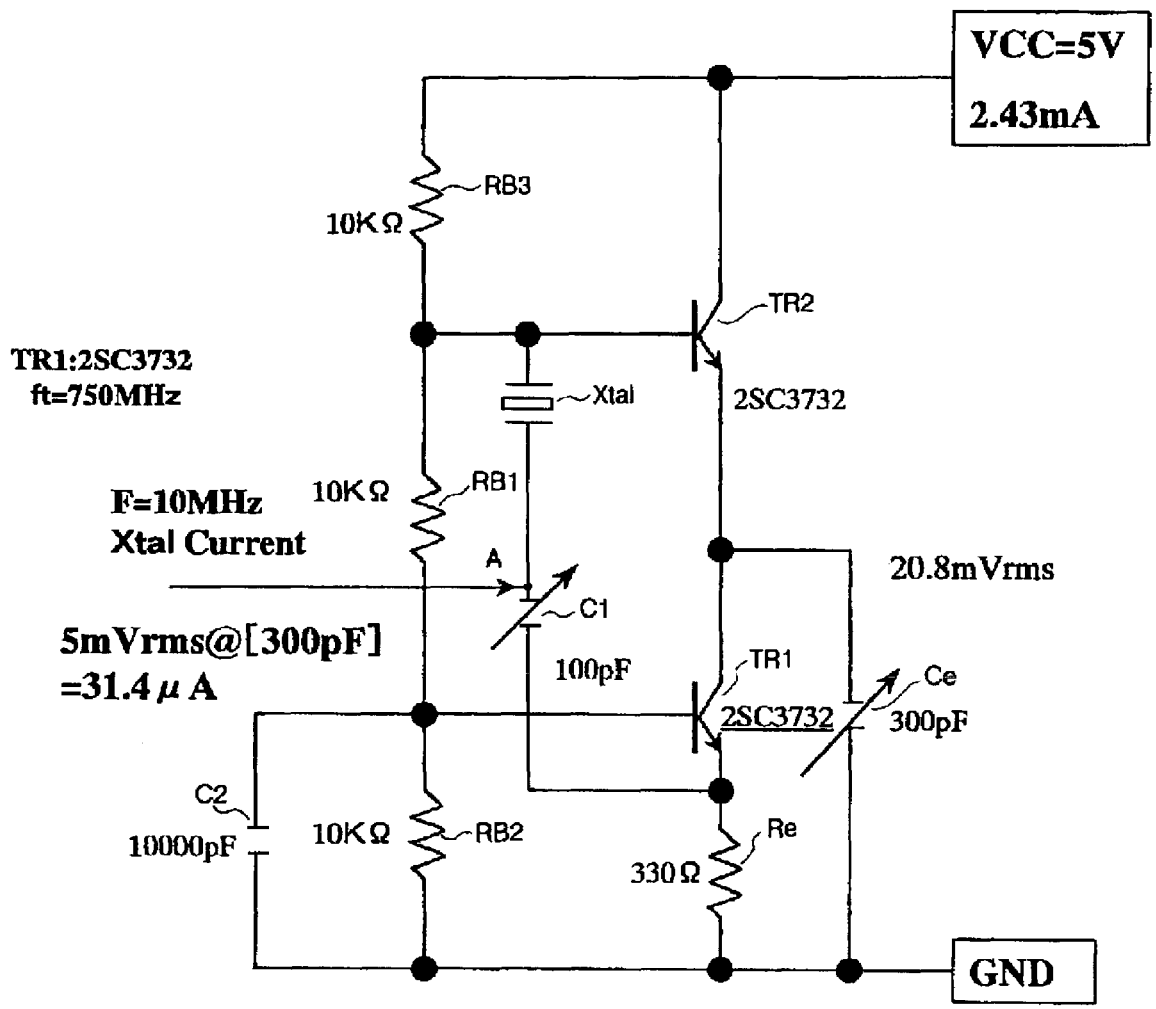
FIG. 1 is a circuit diagram of a Colpitts oscillator according to the present invention.

FIG. 1 is an example of a Colpitts oscillator according to the present invention. A transistor TR2 (the first transistor) and a transistor TR1 (the second transistor) are connected in a cascode configuration by connecting an emitter of the transistor TR2 and a collector of the transistor TR1. The collector of the transistor TR1 is grounded via a capacitor Ce (the first capacitor). A collector of transistor TR2 is connected to a power supply line Vcc. A series circuit of a piezoelectric vibrator Xtal and a capacitor C1 (the second capacitor) for frequency trimming is connected between a base of transistor TR2 and an emitter of the transistor TR1. The emitter of transistor TR1 is grounded via a resistor Re. The base of the transistor TR2 is connected to the power supply line Vcc via a resistor RB3, and is connected to a base of the transistor TR1 via a resistor RB1. The base of the transistor TR1 is grounded via a resistor RB2 and a capacitor C2. The resistor RB3 and a composite impedance of the resistor RB1 and RB2 comprise a base bias circuit for the transistor TR2, and the resistor RB2 and a composite impedance of the resistor RB3 and RB1 comprise a base bias circuit for transistor TR1.

Input impedance is a very low and output impedance can be set as much as a negative resistance so that the transistor TR1 is a base grounded type. The Colpitts oscillator shown in FIG. 1, the output impedance of the transistor TR2 becomes a high level since the output impedance of transistor TR1 contributes to the output impedance of the transistor TR2.

That is, the impedance of the emitter of the transistor TR2 is high, only a reactance component by the capacitor Ce exists between the emitter and ground.

Figure 4:
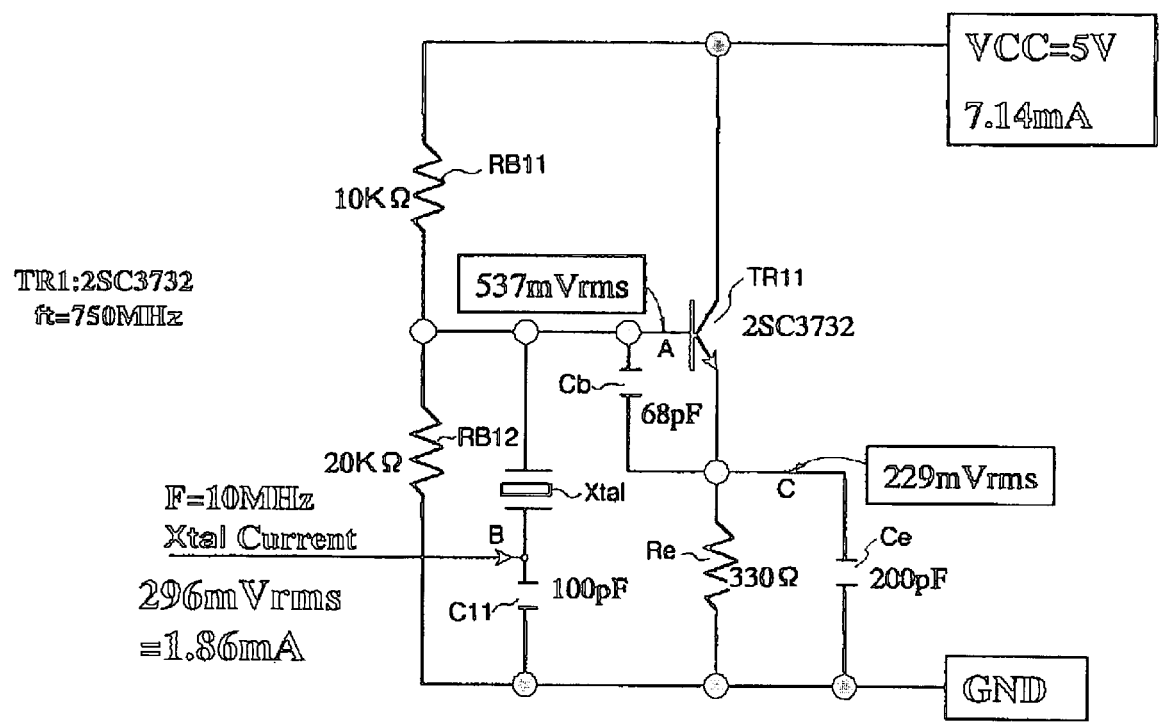
FIG. 4 is a circuit diagram of a conventional Colpitts oscillator.

For example, in the conventional Colpitts oscillator shown in FIG. 4, the resistor Re (Re=330Ω) connected between the emitter of the transistor TR11 and ground is necessary for applying an electric current to the transistor TR11. As a result, a parallel circuit including the resistor Re and capacitor Ce is provided between the emitter of the transistor TR11 and ground. Therefore, output impedance of the conventional Colpitts oscillator is made of a resistance components of the resistor Re and a capacitive reactance of the capacitor Ce.

A negative resistance to be necessary for oscillation produces from the capacitive reactance ($-gm/\omega^2 \cdot C1 \cdot C2$), and the resistance component is one of factors for suppressing the negative resistance.

On the other hand, the Colpitts oscillator of the present invention, the transistor TR1 is a base grounded type, and output impedance of the transistor TR1 is extremely high. Impedance of the emitter of the transistor TR2 consists of a capacitive reactance of the capacitor Ce only. As a result, a resistance component, which is one of factors for suppressing negative resistance, can extremely be lowered, and the large negative resistance can be obtained.

The Colpitts oscillator of the present invention, frequency of the piezoelectric vibrator Xtal is 10 MHz, a signal level and current value at point A are 5 mVrms, 31.4 µA, respectively. A power current (a consumption current of the Colpitts oscillator of the present invention) is 2.43 mA.

As mentioned the above, the transistor TR2 is connected between the power supply line Vcc and the collector of the transistor TR1 that is a base grounded type. The emitter of the transistor TR2 is grounded via the capacitor Ce. A series circuit comprised of the piezoelectric vibrator Xtal and the capacitor C1 is connected between the base of the transistor TR2 and the emitter of the transistor TR1. A composition capacitance between the base and emitter of the transistor TR2 and the capacitor Ce comprises a load capacitance, and functions as a split capacitor for a feedback circuit of the Colpitts oscillator.

It is explained more in detail. Since a phase of a loop signal at the base of the transistor TR2 reverses that of a loop signal at the emitter of the transistor TR2 (180 degrees phase difference), a signal current level of the emitter of the transistor TR1 is low when a signal current level of the base of the transistor TR2 is high. Furthermore, the collector of the transistor TR1 becomes a low level, the composition capacitance between the base and emitter of the transistor TR2 increases according as a difference of the current level in the base and emitter of the transistor TR1 increases. As a result, a proper load capacitance is generated, and an external capacitor component, such as a chip capacitor, to be provided between base and emitter of transistor TR2 is not necessary for the Colpitts oscillator.

Figure 2:
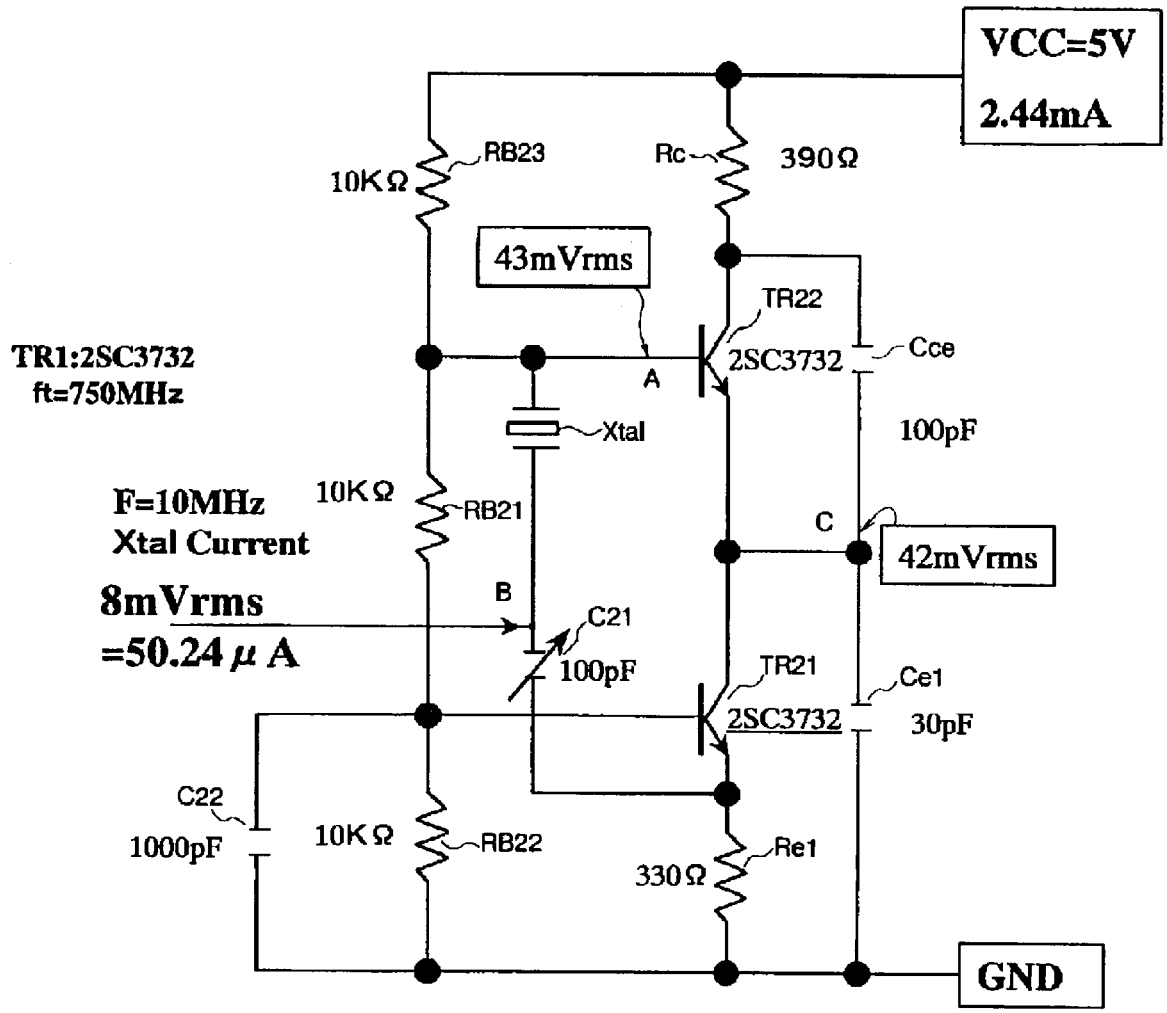
FIG. 2 is a circuit diagram of a Colpitts oscillator according to an embodiment of the present invention.

FIG. 2 illustrates a Colpitts oscillator according to an embodiment of the present invention. A transistor TR22 (the first transistor) and a transistor TR21 (the second transistor) are connected in a cascode configuration by connecting an emitter of a transistor TR22 and a collector of transistor TR21. The collector of the transistor TR21 is grounded via a capacitor Ce1 (the first capacitor), and is connected to a collector of the transistor TR22 via a capacitor Cce (the third capacitor) The collector of the transistor TR22 is connected to a power supply line Vcc via a resistor Rc. A serial circuit of a piezoelectric vibrator Xtal and a capacitor C21 (the second capacitor) for a frequency trimming is connected between a base of the transistor TR22 and an emitter of the transistor TR21. The emitter of the transistor TR21 is grounded via a resistor Re1. The base of the transistor TR22 is connected to the power supply line Vcc via a resistor RB23, and is connected to the base of the transistor TR21 via a resistor RB21. The base of the transistor TR21 is grounded via a resistor RB22 and a capacitor C22. The resistor RB23 and a composite impedance of the resistor RB21 and RB22 comprise a base bias circuit for the transistor TR22, and the resistor RB22 and a composite impedance of the resistor RB23 and RB21 comprise a base bias circuit for the transistor TR21.

The Colpitts oscillator of the present invention, when frequency of the piezoelectric vibrator Xtal is 10 MHz, a signal level at point A is 43 mVrms, a signal level and current at point B are 8 mVrms and 50.24 μA, a signal level at point C is 42 mVrms. A power current (consumption current of the Colpitts oscillator) is 2.44 mA.

The differences between the present embodiment and the previous embodiment are the resistor Rc provided between the collector of the transistor TR22 and the power supply line Vcc, and the capacitor Cce provided between the collector and emitter of the transistor TR22. It is explained more in detail. When a signal current level of the base of the transistor TR22 is high, a signal current level of the emitter of the transistor TR21 is low because 180 degrees are different from a phase of a signal current at the base of the transistor TR22 and a phase of a signal current at the emitter of the transistor TR21. In addition, the collector of the transistor TR21 becomes a low level. Since the emitter of the transistor TR22 connects to the collector of the transistor TR21, the current level of the emitter of the transistor TR22 becomes low. The current flows from the base to emitter of the transistor TR22, the negative resistance increases.

Figure 3:
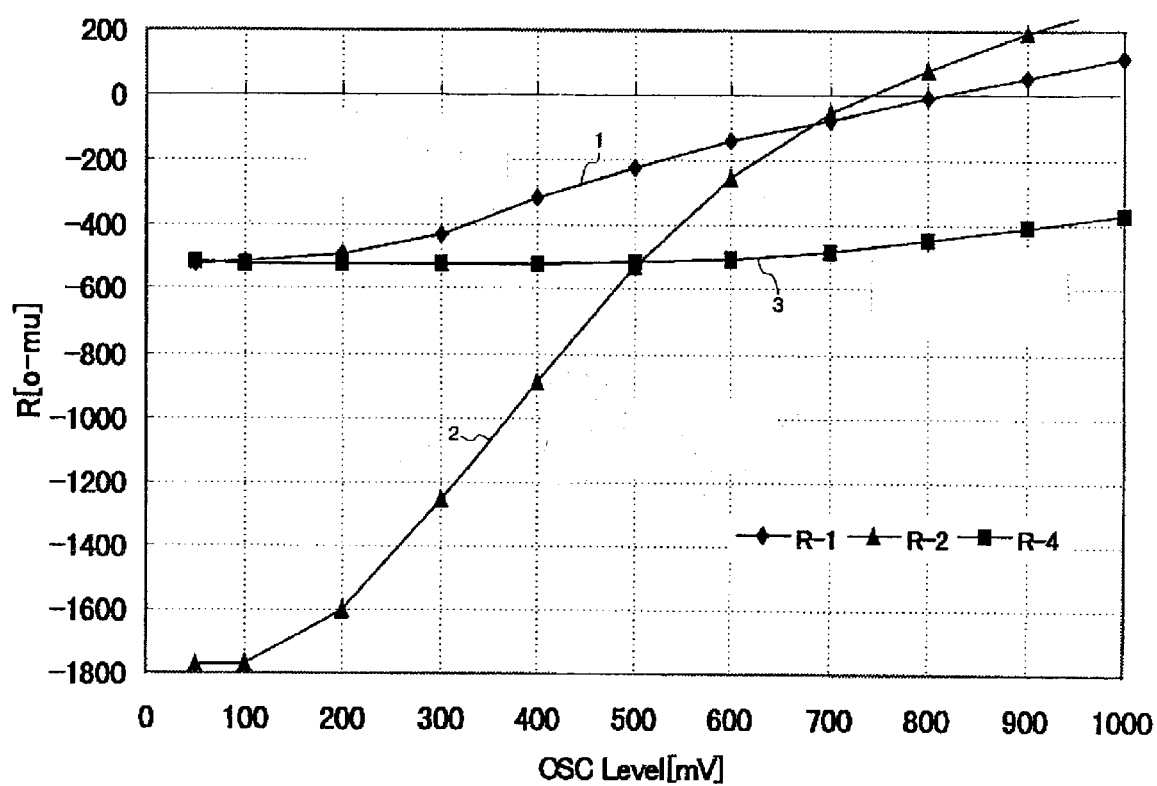
FIG. 3 is a graph showing a relationship between negative resistance and oscillation level of the oscillator according to the embodiment of FIGS. 1 and 2 of the present invention.

FIG. 3 is a graph showing a relationship between a negative resistance and an oscillation level of the oscillator according to both embodiments of the present invention. This simulation is performed by excluding the piezoelectric vibrator from the oscillating circuit of both embodiments, and providing an output signal from an impedance meter to the oscillating circuit. The graph shows the relationship between oscillating level and negative resistance. In FIG. 3, an axis of ordinate expresses negative resistance (Ω), and an axis of the abscissa express an oscillation power level of an impedance meter (mV). In addition, a characteristic curve with numeral 1 expresses the characteristic of the embodiment shown in FIG. 1, characteristic curve with numeral 2 expresses a characteristic of the other embodiment shown in FIG. 2, and characteristics curve with numeral 3 expresses the characteristic of the conventional oscillating circuit shown in FIG. 4, respectively.

As is clear from the graph shown in FIG. 3, when an oscillation level is low, a large negative resistance is obtained. It means that starting of an oscillation is easy. In addition, when the oscillation level is high, a small negative resistance is obtained. It means that an oscillation continues with a small oscillation level (vibrator current) when oscillation becomes stable condition (a stationary state) As a result, an aging characteristic of the oscillator is improved.

On the other hand, as is clear from the characteristic curve of the conventional oscillating circuit presented by numeral 3, a variation of a negative resistance is less even if an oscillation level is changed. The negative resistance maintains about −500Ω, and it is predicted that the oscillation level of the vibrator will be large when an oscillation becomes a stable condition.

The negative resistance of the Colpitts oscillator shown in FIG. 1 is almost the same with that of the conventional oscillation circuit just after starting of circuitry. Therefore, it is easy to start the oscillation. However, the negative resistance drastically decreases as increasing the oscillation level. It means that the oscillation continues with a low oscillation level (low vibration current).

Furthermore, a starting negative resistance of the Colpitts oscillator shown in FIG. 2 is very high, and it is about 3 times value as compared with the other circuits (it is about −1,800Ω). Hence, the Colpitts oscillator shown in FIG. 2 easily oscillates just after starting of circuitry. The negative resistance drastically decreases as increasing the oscillation level. It means that the oscillation continues with a low oscillation level (low vibration current).

As mentioned the above, in the embodiments of the present invention shown in FIGS. 1 and 2, the load capacitance of the feedback part of the Colpitts oscillator is provided by the composition capacitance between base and emitter of transistor TR2 or TR22 without using the independent capacitor to be provided between base and emitter of transistor TR2 or TR22. However, the independent capacitor may be used in a Colpitts oscillator of the present invention according to demand.

Figure 5:
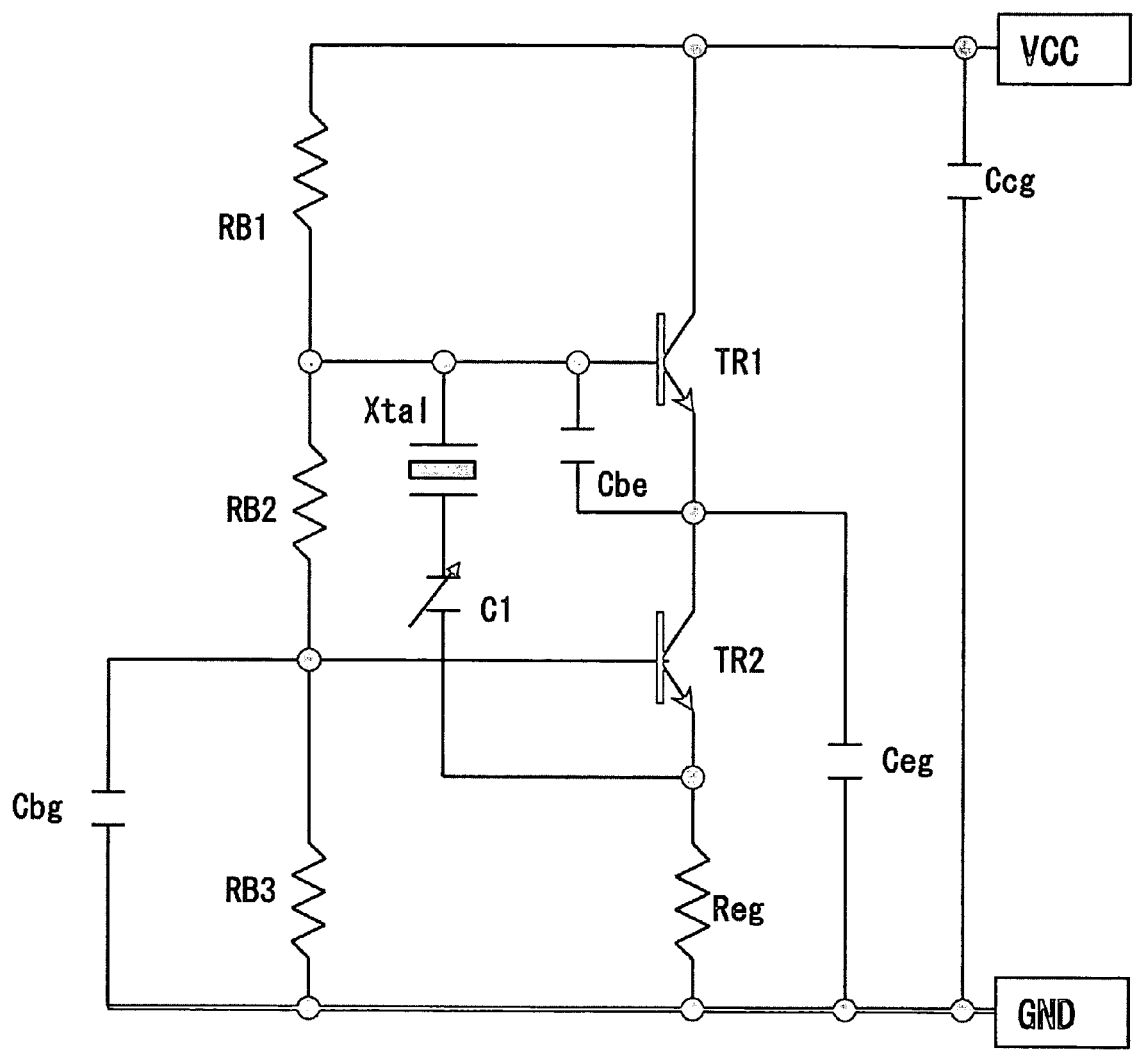
FIG. 5 is another circuit diagram of a Colpitts oscillator according to the embodiment of FIG. 1 of the present invention.
Figure 6:
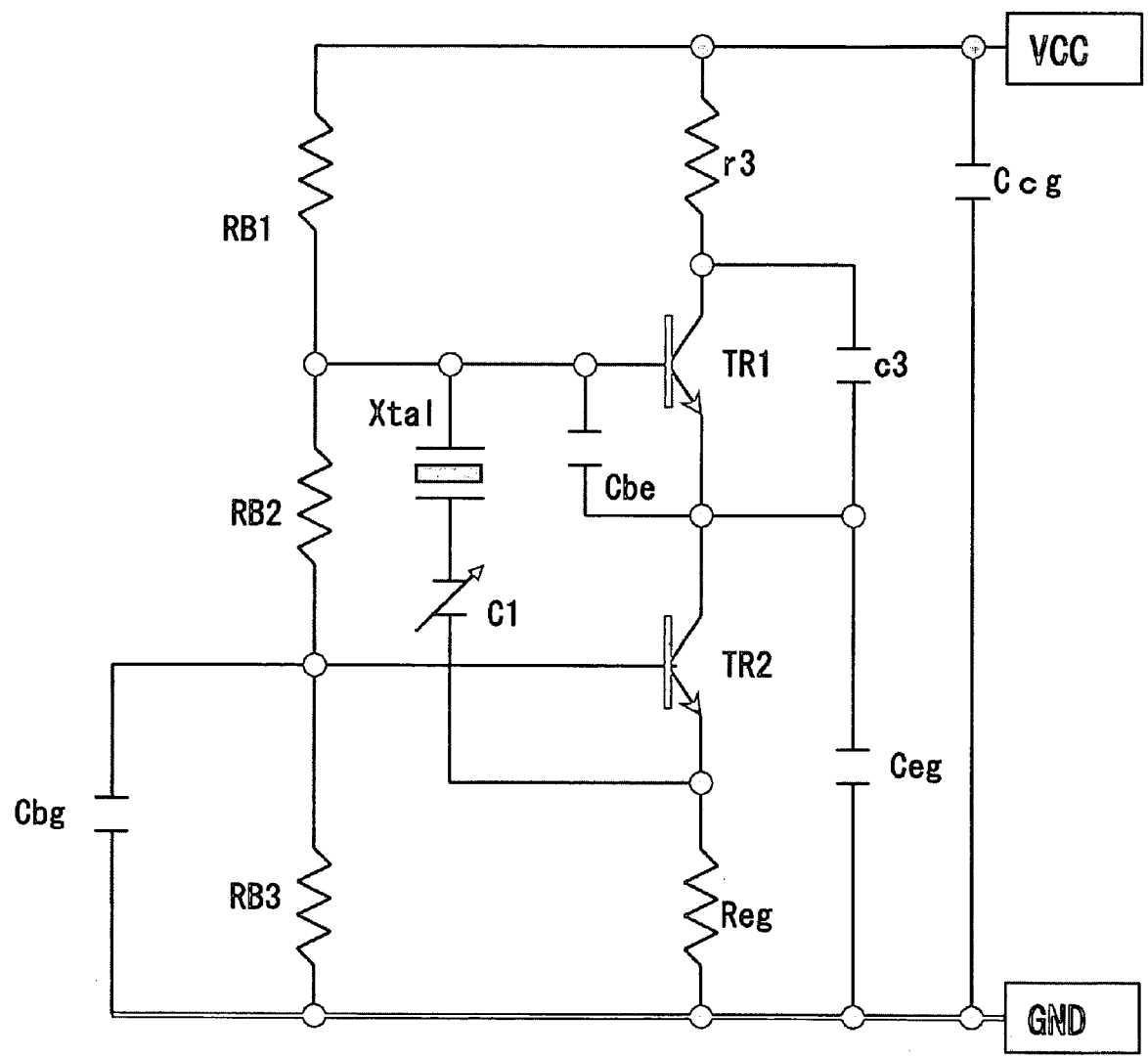
FIG. 6 is another circuit diagram of a Colpitts oscillator according to the embodiment of FIG. 2 of the present invention.
Figure 7:
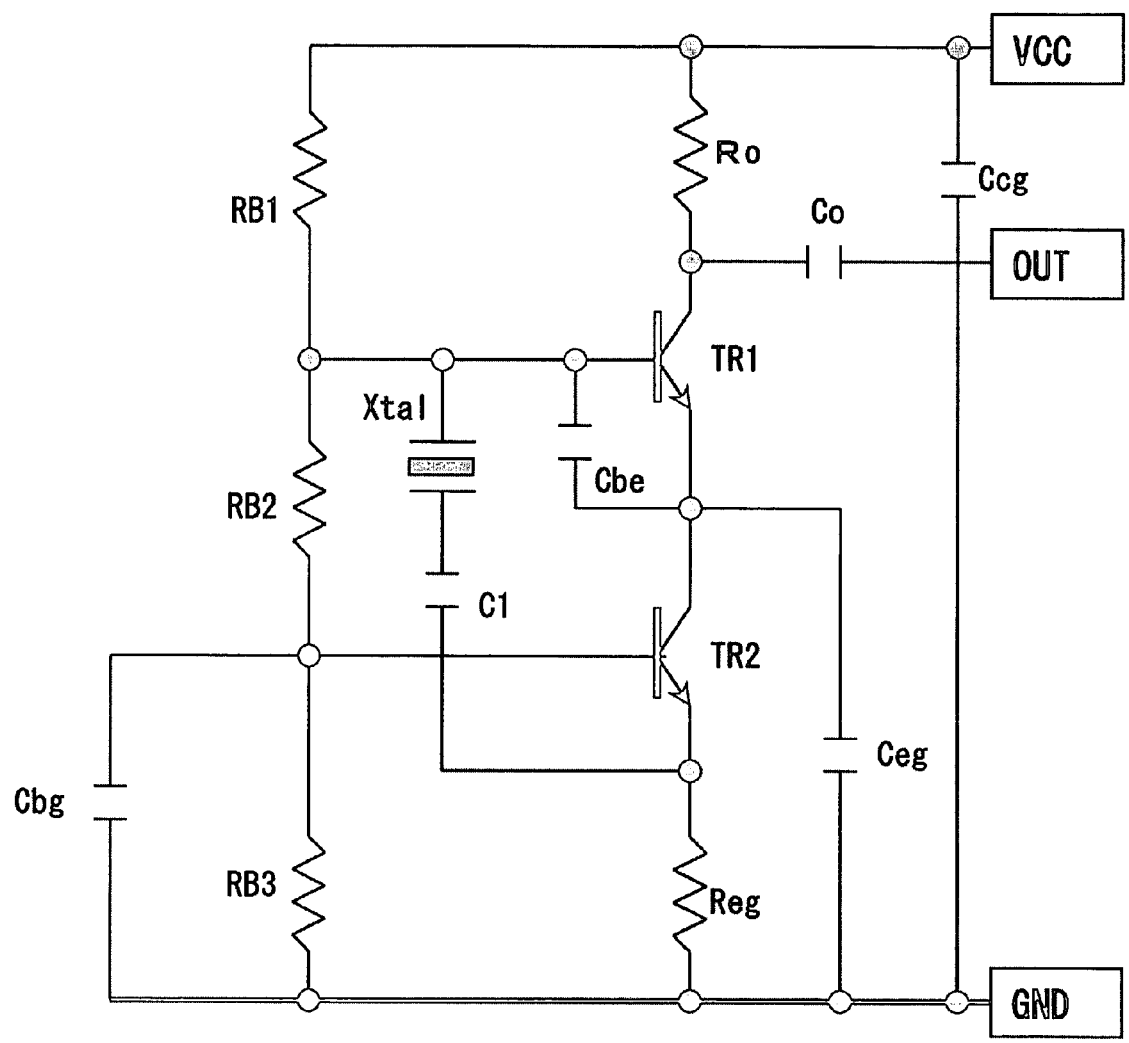
FIG. 7 is a circuit diagram of an embodiment of a Colpitts oscillator according to the present invention.
Figure 8:
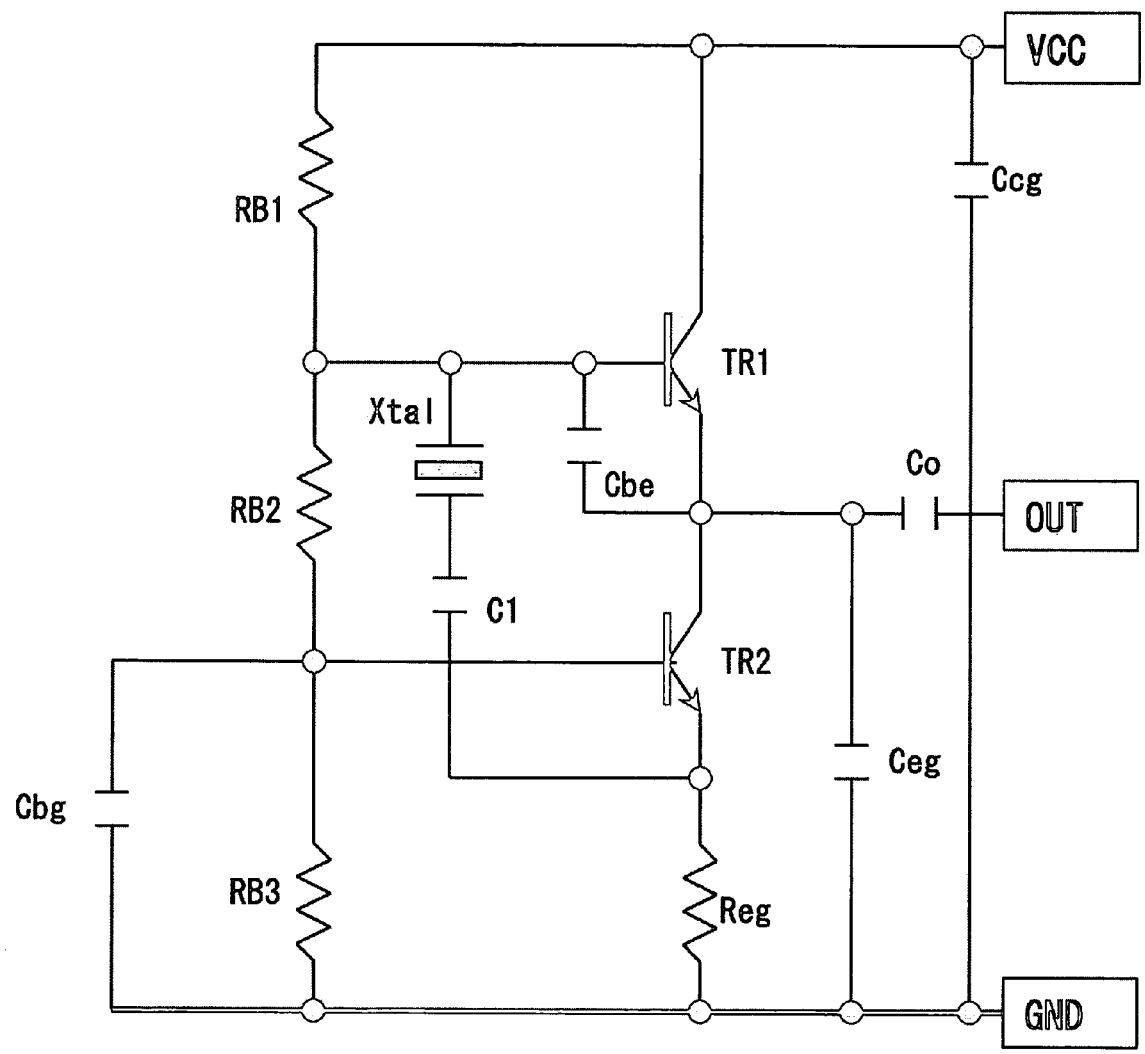
FIG. 8 is a circuit diagram of an embodiment of a Colpitts oscillator according to the present invention.
Figure 9:
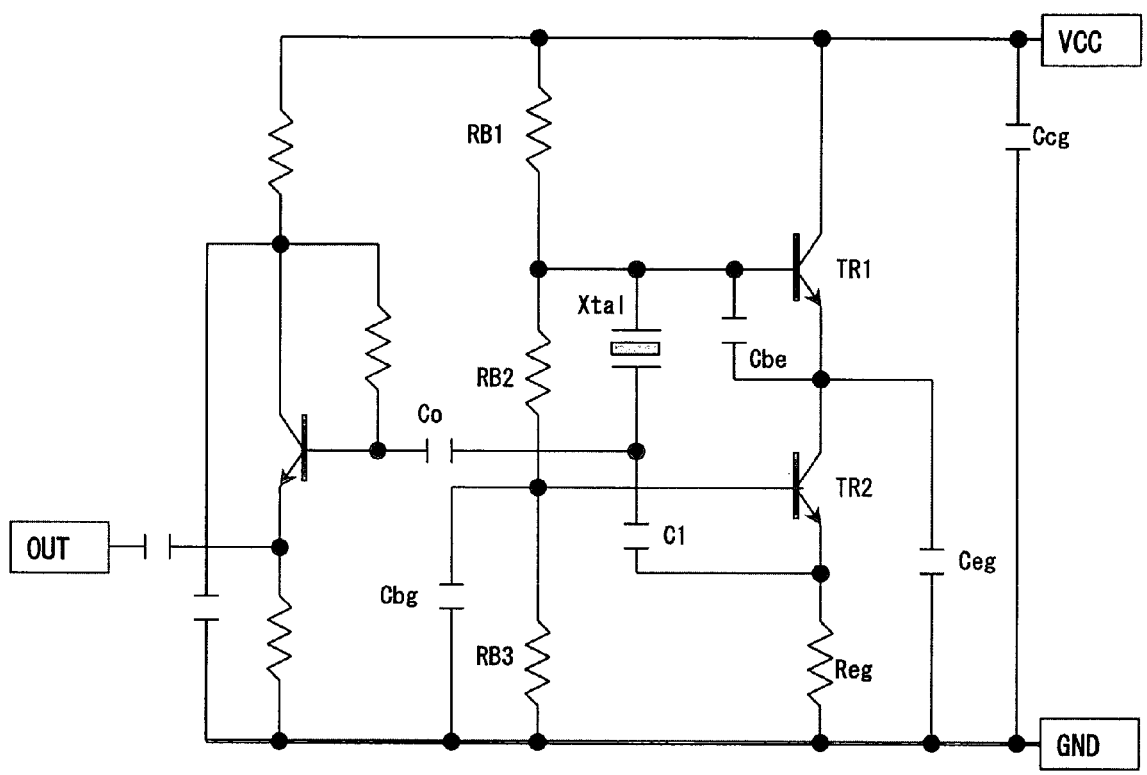
FIG. 9 is a circuit diagram of an embodiment of a Colpitts oscillator according to the present invention.
Figure 10:
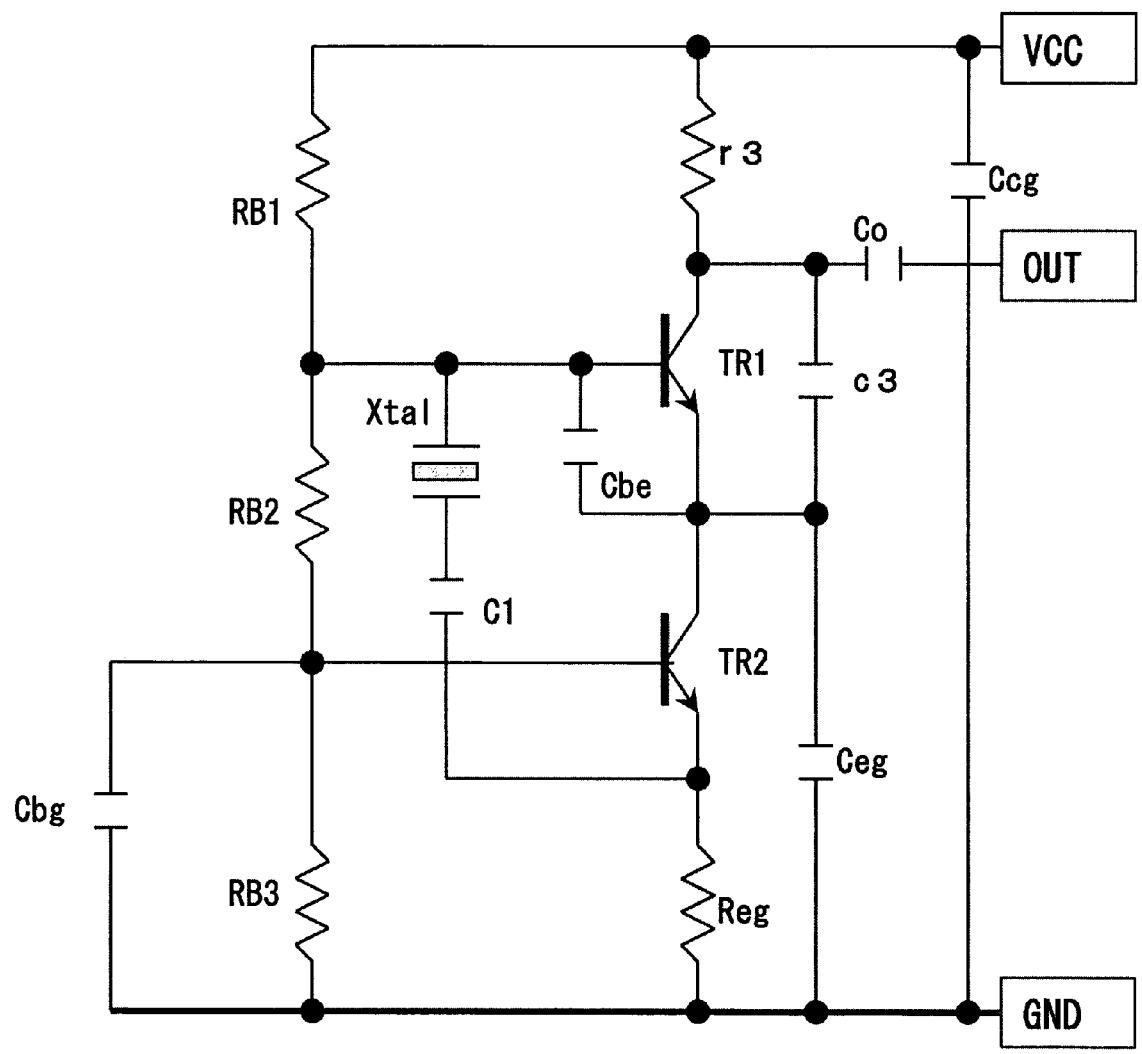
FIG. 10 is a circuit diagram of an embodiment of a Colpitts oscillator according to the present invention.
Figure 11:
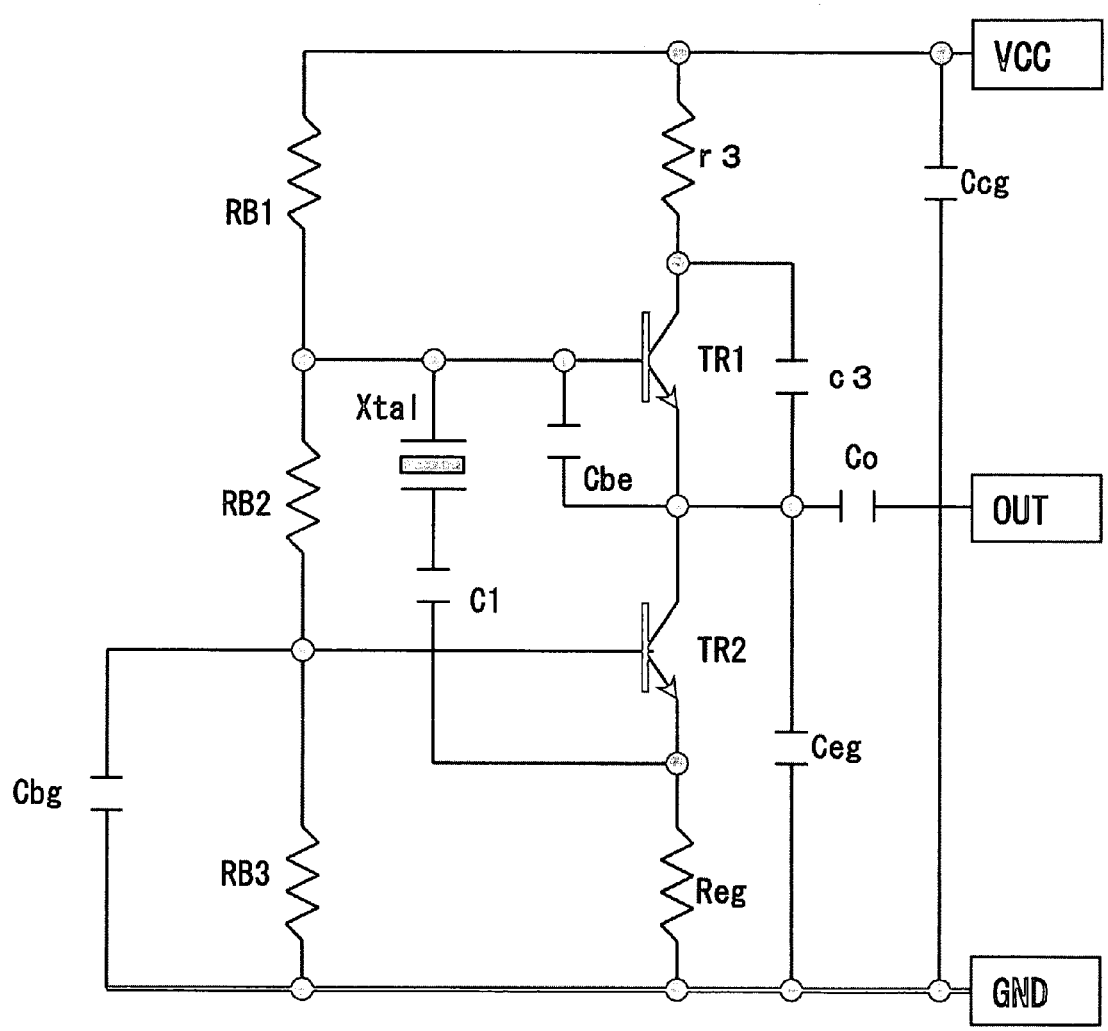
FIG. 11 is a circuit diagram of an embodiment of a Colpitts oscillator according to the present invention.
Figure 12:
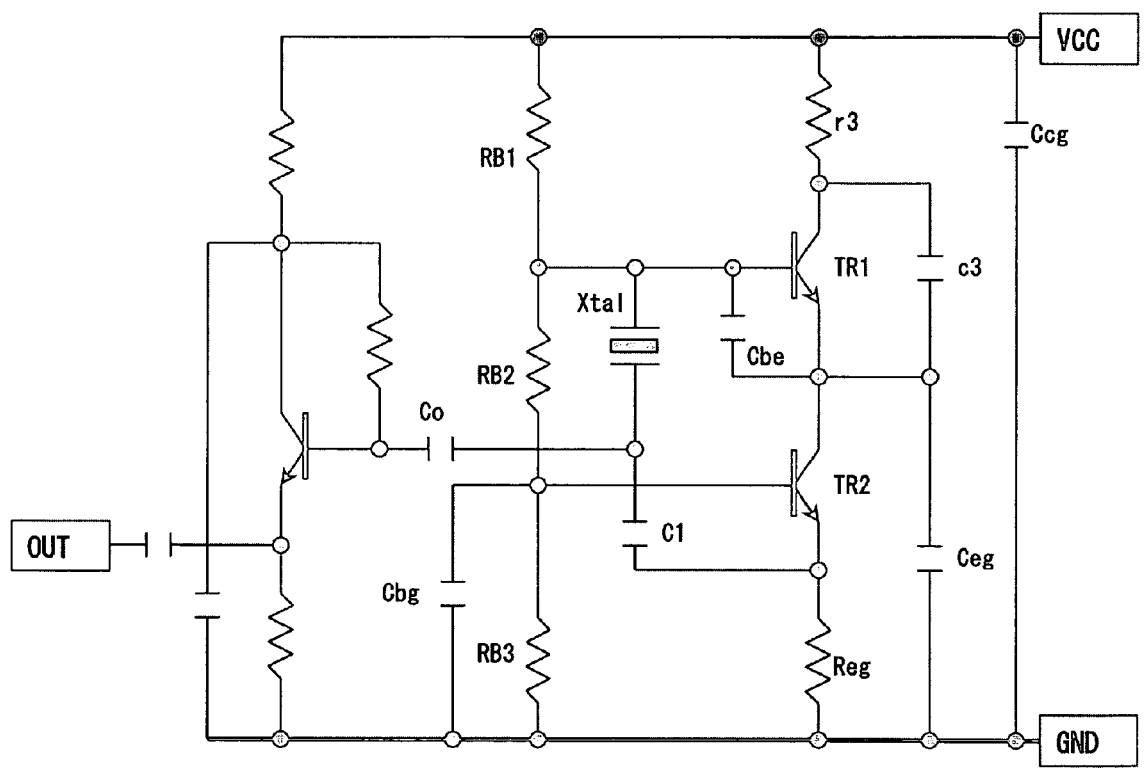
FIG. 12 is a circuit diagram of an embodiment of a Colpitts oscillator according to the present invention.

FIGS. 5 and 6 are the other embodiments of the present invention in which an independent capacitor Cbe (the fourth capacitor) is provided between the base and emitter of the transistor TR2 or TR22.

The vibrator current of the embodiment shown in FIG. 5 is larger than that of the embodiment shown in FIG. 1, and the vibrator current of the embodiment shown in FIG. 6 is also larger than that of the embodiment shown in FIG. 2. However, frequency stability of these embodiments shown in FIGS. 5 and 6 are improved than the embodiments shown in FIGS. 1 and 2. Therefore, capacity value of the capacitance Cbe is chosen in consideration of consumption current of the oscillator and desired frequency stability.

In the embodiments shown in FIGS. 5 and 6, a capacitor Ccg provided between the power supply line Vcc and ground is utilized as by-pass capacitor, and the by-pass capacitor may be used in the embodiment shown in FIGS. 1 and 2.

The variations of the output configuration of the Colpitts oscillator are shown in FIG. 7 through FIG. 12.

The one aspect of the present invention, the load capacitance of the Colpitts oscillator is formed by a capacitor and a composition capacitance between the base and emitter of the oscillation transistor (the first transistor). Therefore, the Colpitts oscillator, whose vibration current is suppressed, can be obtained since a capacitance component between the base and emitter of the transistor for oscillation is small.

Another aspect of the present invention, the load capacitance of the oscillation transistor can be increased since an emitter output of the oscillation transistor is suppressed by a collector output of the oscillation transistor.

Also in the present invention, the Colpitts oscillator having less deterioration of the wave form can be obtained since each bases of the oscillation transistor (the first transistor) and the base grounded transistor (the second transistor) is biased by the required voltage.

Additionally, an independent capacitor Cbe is provided between the base and emitter of the transistor. Therefore, frequency stability is improved.

What is claimed:

1. A piezoelectric oscillator comprising:
   a piezoelectric vibrator vibrating at a desired frequency;
   a first transistor for exciting said piezoelectric vibrator;
   a second transistor having a collector connecting to an emitter of said first transistor, said second transistor being a base grounded type;
   a first capacitor connected between said emitter of said first transistor and a ground;
   a series circuit comprising said piezoelectric vibrator and a second capacitor being connected between a base of said first transistor and an emitter of said second transistor,
   wherein said first capacitor and a composition capacitance between said base and said emitter of said first transistor functions as a split capacitor for a feedback circuit of the Colpitts oscillator.

2. A piezoelectric oscillator according to claim 1, further comprising:
   a base of said second transistor grounded via capacitor.

3. A piezoelectric oscillator according to claim 1, further comprising:
   a fourth capacitor connected between said base and said emitter of said first transistor, thereby a variation of said composition capacitance between said base and said emitter of said first transistor being cancelled, and a high frequency stability being obtained.

4. A piezoelectric oscillator according to claim 1, further comprising:
   a base of said second transistor being grounded via capacitor; and
   a fourth capacitor being connected between said base and said emitter of said first transistor, thereby a variation of said composition capacitance between said base and said emitter of said first transistor being cancelled, and a high frequency stability being obtained.

5. A piezoelectric oscillator comprising:
   a piezoelectric vibrator vibrating at a desired frequency;
   a first transistor for exciting said piezoelectric vibrator;
   a second transistor having a collector connecting to an emitter of said first transistor, said second transistor being a base grounded type;
   a first capacitor connected between said emitter of said first transistor and a ground;
   a third capacitor connected between a collector and said emitter of said first transistor;
   a series circuit comprising said piezoelectric vibrator and a second capacitor being connected between a base of said first transistor and an emitter of said second transistor,
   wherein said first capacitor and a composition capacitance between said base and said emitter of said first transistor functions as a split capacitor for a feedback circuit of the Colpitts oscillator.

6. A piezoelectric oscillator according to claim 5, further comprising:
   a base of said second transistor grounded via capacitor.

7. A piezoelectric oscillator according to claim 5, further comprising:
   a fourth capacitor connected between said base and said emitter of said first transistor, thereby a variation of said composition capacitance between said base and said emitter of said first transistor being cancelled, and a high frequency stability being obtained.

8. A piezoelectric oscillator according to claim 5, further comprising:
   a base of said second transistor being grounded via capacitor; and
   a fourth capacitor being connected between said base and said emitter of said first transistor, thereby a variation of said composition capacitance between said base and said emitter of said first transistor being cancelled, and a high frequency stability being obtained.

* * * * *